US006825648B2

(12) United States Patent
Duggan

(10) Patent No.: US 6,825,648 B2
(45) Date of Patent: Nov. 30, 2004

(54) DISTRIBUTORLESS IGNITION ADAPTER FOR DIAGNOSTIC OSCILLOSCOPES

(76) Inventor: Rodney James Duggan, 11319-51st Avenue, Edmonton, Alberta (CA), T6H 0L8

( * ) Notice: Subject to any disclaimer, the term of this patent is extended or adjusted under 35 U.S.C. 154(b) by 102 days.

(21) Appl. No.: 10/246,130

(22) Filed: Sep. 17, 2002

(65) Prior Publication Data

US 2003/0052665 A1 Mar. 20, 2003

(30) Foreign Application Priority Data

Sep. 17, 2001 (CA) ............................................ 2357674

(51) Int. Cl.[7] .......................... G01R 19/00; F02P 17/00
(52) U.S. Cl. .................................. 324/121 R; 324/402
(58) Field of Search ............................ 324/121 R, 318, 324/378, 239, 397, 402, 76.11, 380, 393; 345/24; 123/634, 635, 636

(56) References Cited

U.S. PATENT DOCUMENTS

| | | | | | |
|---|---|---|---|---|---|
| 3,731,184 | A | * | 5/1973 | Goldberg et al. | 324/239 |
| 4,644,284 | A | * | 2/1987 | Friedline et al. | 324/397 |
| 4,791,372 | A | * | 12/1988 | Kirk et al. | 324/318 |
| 4,937,527 | A | * | 6/1990 | Sniegowski et al. | 324/402 |
| 5,004,984 | A | * | 4/1991 | Becker et al. | 324/402 |
| 5,017,874 | A | * | 5/1991 | Di Nunzio et al. | 324/378 |
| 5,132,625 | A | | 7/1992 | Shaland | 324/392 |
| 5,218,302 | A | | 6/1993 | Loewe et al. | 324/380 |
| 5,296,869 | A | * | 3/1994 | Jonker et al. | 345/24 |
| 5,614,828 | A | | 3/1997 | Sims | 324/402 |
| 5,834,939 | A | | 11/1998 | Makhija | 324/402 |
| 5,842,456 | A | * | 12/1998 | Morganti | 123/606 |
| 6,396,278 | B1 | | 5/2002 | Makhija | 324/402 |
| 6,427,674 | B1 | * | 8/2002 | Wylin | 123/634 |
| 6,679,236 | B2 | * | 1/2004 | Skinner et al. | 123/634 |

* cited by examiner

*Primary Examiner*—Anjan Deb
*Assistant Examiner*—Hoai-An D. Nguyen
(74) *Attorney, Agent, or Firm*—Christensen O'Connor Johnson Kindness PLLC

(57) ABSTRACT

A distributorless ignition adapter for diagnostic oscilloscopes which an interface box, an oscilloscope connection cord and several inductive pick ups. The oscilloscope connection cord has a first end connected to the interface box and a second end terminating in an oscilloscope plug. The several inductive pick ups are connected to the interface box, whereby passage of electrical current through ignition coils is sensed and data relating to properties of the electrical current is transmitted to an oscilloscope via the interface box and the oscilloscope connection cord. Preferably, each of the several inductive pick ups is sufficiently flexible to wrap around an ignition coil. This enables the inductive pick ups to be adapted to different sizes of ignition coil. Preferably, each of the several inductive pick ups is detachably secured to the interface box. This enables a technician to alter the number of inductive pick ups to correspond with the number of ignition coils for a particular model of engine.

4 Claims, 2 Drawing Sheets

DISTRIBUTORLESS IGNITION ADAPTER FOR DIAGNOSTIC OSCILLOSCOPES

FIELD OF THE INVENTION

The Invention relates to the field of ignition system diagnostics.

In particular, the Invention, in one embodiment, is an adapter that enables the continued use of existing oscilloscopes to test secondary ignition patterns with the new style coil on ignition systems adopted by the majority of automobile manufactures.

The Invention has particular application (but is not thereby limited) in the field of automotive mechanics and diagnostics, where it is useful to use existing automotive diagnostic equipment, such as multi-strike capable oscilloscopes, to test secondary ignition patterns on coil on plug ignition systems, and to be capable of viewing multi cylinder waveforms on the read-out screen at the same time.

BACKGROUND OF THE INVENTION

For the past many years automobile gasoline engines have been diagnosed using an automotive oscilloscope attached to the ignition system. This produces a waveform on a screen that provides valuable information on the internal condition of some components of the engine and of its ability to run at peak efficiency, that the spark generated by the ignition coil has been distributed to the proper spark plug and related wiring at the correct the time via a device called the distributor. It is a mechanical device that operates at a revolutionary speed of one half that of the crankshaft and is an integral part of the engine. The spark voltage in common practice is negative (−) in relation to engine ground.

With modern computer technology the distributor has been deleted from the engine and spark has been controlled with an on board computer controlling multiple ignition coils instead of just one in the case of a distributor equipped engine. A six cylinder engine would be equipped with three ignition coils capable of sparking at both positive (+) and negative (−) voltages. A new technology was developed to allow automotive oscilloscopes to test this type of ignition system. By having one inductive pickup attached to each spark plug wire (instead of just one on a distributor equipped model that would attach between the coil and distributor) the oscilloscope could read this data and display it on the screen after inverting the positive signals to be displayed properly.

Starting around 1997 many vehicle manufacturers started using a new technology that had one ignition coil per spark plug and in some cases it would sit directly on top of the spark plug with no external wiring to allow an inductive pickup to be attached. With this new system all coils produce a negative (−) spark. The vehicle manufacturing community decided that all diagnostics on this system could be done with the onboard computer and proper interface tool, eliminating the need for an automotive oscilloscope. The engine diagnostic equipment manufacturing community, perhaps seeing a chance to sell expensive on board computer interface diagnostic tools, have not pursued creating an adapter for their existing equipment. The fact remains that many automotive shops and technicians have purchased expensive equipment to work on the older vehicles and many automotive technicians have spent years refining their ability to read ignition waveforms and feel that a valuable part of their diagnostic routine has been taken away from them.

It is well-known in the art to use an apparatus or method to determine and display information relating to ignition systems diagnostics. See for example CDN Patent No. 1,050,110, which is comprised of an automotive analyzer apparatus with oscilloscope and probe means, and U.S. Pat. No. 5,296,869, a digital engine analyzer with oscilloscope display and microprocessor. Also see CDN Patent No. 2,321,510, which describes an apparatus and method for detecting electric ignition signals for a coil on plug of an internal combustion engine, and CDN Patent No. 2,133,689, an apparatus and method for engine diagnosis using waveform analysis.

Testing of distributorless ignition systems has also been known for some time. See U.S. Pat. No. 5,641,898, which discloses an ignition module tester with electrical input terminals and CDN Patent No. 2,148,057, a distributorless ignition test device comprised of an adapter with inport port coupled to an electrical ground.

It is also known to use adapters in the field of ignition diagnostics. See U.S. Pat. No. 5,132,625, which is comprised of ignition spark sensing and detection means with manual voltage amplitude variation for a method and means for a distributorless ignition adapter for diagnostic oscilloscopes.

SUMMARY OF THE INVENTION

It is an object of the Invention to overcome limitations in the prior art of vehicle ignition diagnostic equipment and methods. The existing prior art inadequately addresses the need for an affordable and useful interface between widely used diagnostic equipment and the recently developed computerized vehicle ignition systems. None of the prior art discloses a practical invention that utilizes a method or means to accommodate interaction between oscilloscopes and coil ignition systems.

According to the teachings of the present invention there is provided a distributorless ignition adapter for diagnostic oscilloscopes which includes an interface box, an oscilloscope connection cord and several inductive pick ups. The oscilloscope connection cord has a first end connected to the interface box and a second end terminating in an oscilloscope plug. The several inductive pick ups are connected to the interface box, whereby passage of electrical current through ignition coils is sensed and data relating to properties of the electrical current is transmitted to an oscilloscope via the interface box and the oscilloscope connection cord.

The Invention relates to an adapter device that enables interaction between engine coil ignition systems and oscilloscopes. The Invention has particular application (but is not thereby limited) in the field of automotive ignition system diagnostics, where it is particularly beneficial to automotive technicians to have the ability to use previously purchased and adopted diagnostic equipment, with the in-line coil ignition systems, recently developed by vehicle manufacturers.

Although beneficial results may be obtained through the use of the distributorless ignition adapter for diagnostic oscilloscopes, as described above, even more beneficial results may be obtained when each of the several inductive pick ups is sufficiently flexible to wrap around an ignition coil. This enables the inductive pick ups to be adapted to different sizes of ignition coil.

Although beneficial results may be obtained through the use of the distributorless ignition adapter for diagnostic oscilloscopes, as described above, even more beneficial results may be obtained when each of the several inductive pick ups is detachably secured to the interface box. This enables a service technician to alter the number of inductive pick ups to correspond with the number of ignition coils for a particular model of engine. One way of detachably securing the inductive pick ups to the interface box is to provide the interface box with a plurality of receiving jacks. Each of the several inductive pick ups can be provided with a lead wire terminating in a pick up plug which is adapted to mate with one of the plurality of receiving jacks.

The Invention was designed to permit interaction between vehicles such as Ford vehicles with coil on plug ignition systems and the majority of 12V negative firing ignition systems that permit inductive pickup connection to the outer case of the ignition coil(s), with oscilloscopes with distributorless ignition system connectors or standard ignition secondary pickups. The Invention enables the reading for each ignition coil to be displayed on a suitable oscilloscope read out screen at the same time, such that a ten cylinder engine with ten ignition coils, would simultaneously have ten cylinder waveforms displayed on the oscilloscope read out screen. As the inductive pickups on the Invention are removable, it permits an oscilloscope to be used with engines that are not normally capable of being diagnosed in this manner, such as motorcycles and other small engines. Also, the use of flexible pickups allows for variations in coil size from different manufacturers and reduces the need for multiple sets of leads. A yellow colour was chosen for the colour of several components of the Invention as it is the colour normally associated with secondary ignition testing and it makes the components much more visible for easier installation on the ignition system being tested, there also being a safety factor in making things highly visible (although yellow is not claimed as a necessary or essential feature).

These and other objects and advantages of the Invention are apparent in the following description of the preferred embodiment of the Invention, which is not intended to limit in any way the scope or the claims of the Invention.

DESCRIPTION OF THE INVENTION

The preferred embodiment of the Invention displays a preferred composition but is not intended to limit the scope of the Invention. It will be obvious to those skilled in the art that variations and modifications may be made without departing from the scope and essential elements of the Invention.

The preferred embodiment of the Invention is a coil ignition oscilloscope adapter device comprised of interface box 1, receiving jacks 2, pickup plugs 3, lead wires 4 flexible inductive pickups 5, connection cord 6 and oscilloscope plug 7.

BRIEF DESCRIPTION OF DRAWINGS

FIG. One (1) is a perspective view of an embodiment of the Invention.

FIG. Two (2) is a frontal elevation of an embodiment of the Invention.

DETAILED DESCRIPTION OF A PREFERRED EMBODIMENT

Figure 1:
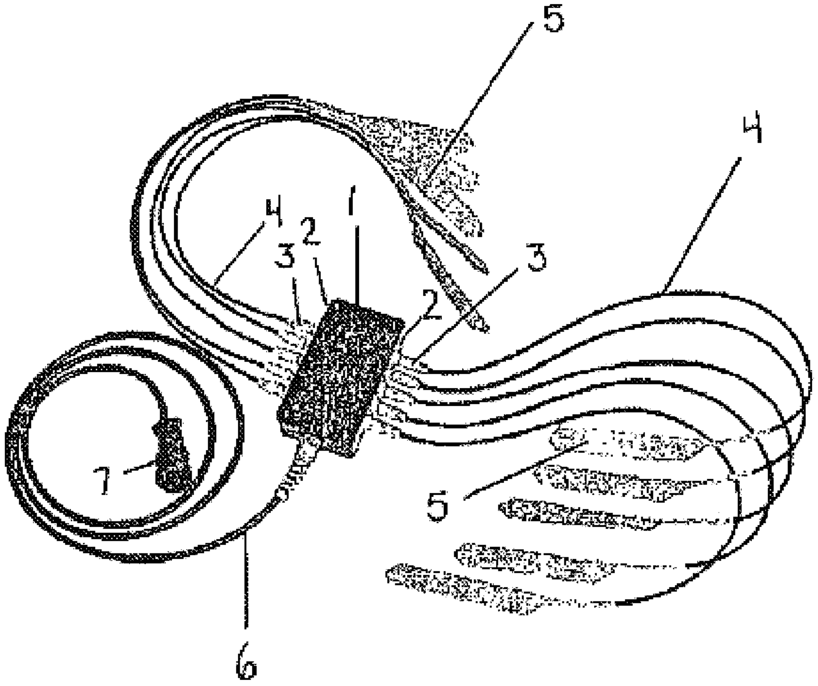
Figure 2:
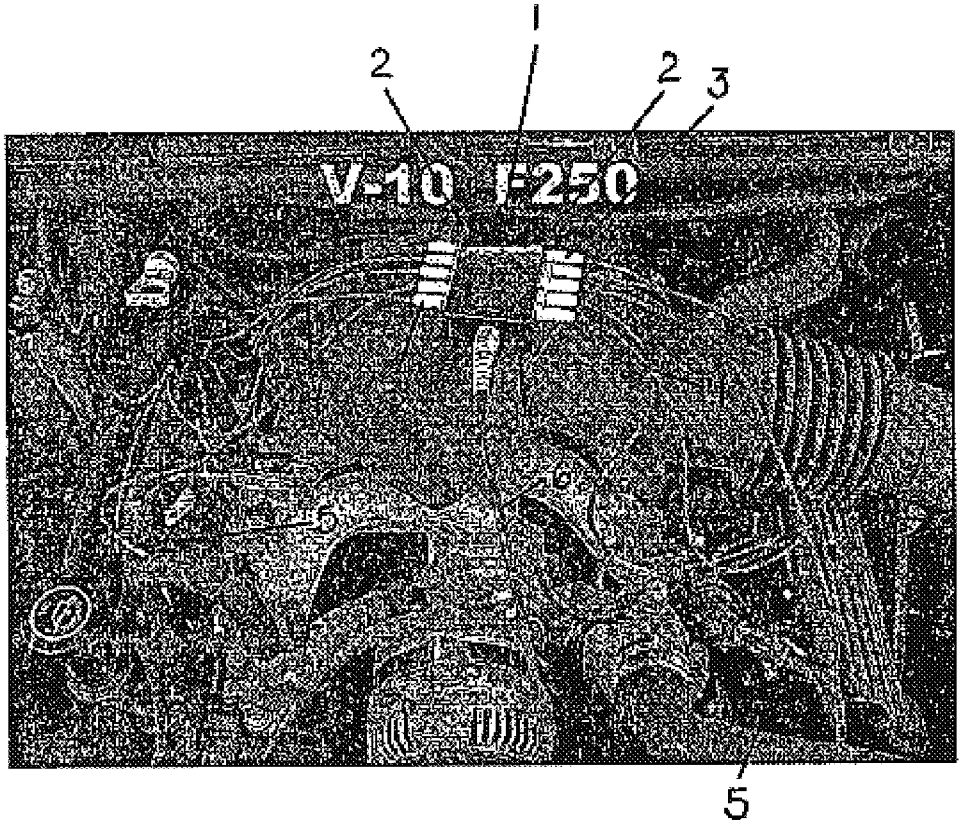

FIG. One (1) illustrates a perspective view of an embodiment of the Invention, comprised of interface box 1, receiving jacks 2, pickup plugs 3, lead wires 4 flexible inductive pickups 5, connection cord 6 and oscilloscope plug 7.

The Invention is an interface box 1, with a number of receiving jacks 2 on each side, and a connection cord 6 with an oscilloscope plug 7 at the end. Pickup plugs 3, attached to lead wires 4 and flexible inductive pickups 5, are inserted into the receiving jacks 2 on the interface box 1. The flexible inductive pickups 5 are wrapped around various sizes of ignition coils in various makes and models of vehicles. The oscilloscope plug 7 attaches to the distributorless ignition system connector or standard ignition secondary pickup on various makes and models of oscilloscopes.

FIG. Two (2) illustrates a perspective elevation of an embodiment of the Invention in use, comprised of interface box 1, receiving jacks 2, pickup plugs 3, lead wires 4 flexible inductive pickups 5 and connection cord 6.

The interface box 1 is placed within the vicinity of the vehicle ignition system such that the flexible inductive pickups 5 can reach the ignition coils and the connection cord 6 can reach the oscilloscope (not shown), and such that the engine fan and other moving or hot engine components will not be contacted. The number of flexible inductive pickups 5 corresponds with the size of the engine, such that if the vehicle ignition system is comprised of four ignition coils, four flexible inductive pickups 5 will be used. The flexible inductive pickups 5 are firmly wrapped around each ignition coil, ensuring that the flexible inductive pickups 5 are not shorted to ground. The pickup plugs 3 are inserted into the receiving jacks 2 on the interface box 1. The oscilloscope plug (not shown) is connected to the distributorless ignition system connector or standard ignition secondary pickup on the oscilloscope. Once the components are connected, ignition patterns are selected and utilized in the normal fashion familiar to automotive technicians. The ignition system diagnostic reading or message is not generated by the Invention, as the Invention only acts as a conduit for the reading. In use, the Invention enables the reading from each ignition coil to pass through the corresponding flexible inductive pickup 5, through the lead wire 4 to the interface box 1 that is connected to the lead wire 4 and inductive pickup 5, via the pickup plug 3 that is inserted into the receiving jack 2 on the interface box 1. The ignition coil reading travels from the interface box 1 to the oscilloscope via the connection cord 6 that attaches the interface box 1 to the oscilloscope by the oscilloscope plug. Each reading is simultaneously displayed on the oscilloscope and interpreted accordingly.

All components of the Invention may be comprised of any suitable component or material, including but not limited to a Hammond ABS instrument box or other suitable type of instrument box for the interface box, yellow banana jacks or other suitable matter for the jacks, yellow banana plugs or other suitable matter for the pickup plugs, 20 gauge black test lead wire for the lead wires, flexible copper inductive pickups for the inductive pickups, AMP strain relief female plug and shell and AMP female socket contacts for oscilloscope plug, and a flexible coaxial cable for connection cord.

In the foregoing Description, the Invention has been described in its preferred embodiments. However, it will be evident that various modifications and changes may be made without departing from the broader scope and spirit of the Invention.

Accordingly, the present specifications and embodiments are to be regarded as illustrative rather than restrictive.

The descriptions here are meant to be exemplary and not limiting. It is to be understood that a reader skilled in the art will derive from this descriptive material the concepts of this Invention, and that there are a variety of other possible implementations; substitution of different specific components for those mentioned here will not be sufficient to differ from the Invention described where the substituted components are functionally equivalent.

What is claimed is:

1. A distributorless ignition adapter for diagnostic oscilloscopes, comprising:

an interface box;

an oscilloscope connection cord having a first end connected to the interface box and a second end terminating in an oscilloscope plug;

several inductive pick ups connected to the interface box, whereby passage of electrical current through ignition coils is sensed and data relating to properties of the electrical current is transmitted to an oscilloscope via the interface box and the oscilloscope connection cord;

the number of inductive pick ups corresponding in one to one relation with the number of ignition coils for a particular model of engine having a coil on plug ignition system; and each of the several inductive pick ups is sufficiently flexible to wrap around an ignition coil.

2. The distributorless ignition adapter for diagnostic oscilloscopes as defined in claim 1, wherein each of the several inductive pick ups is detachably secured to the interface box, thereby enabling a service technician to alter the number of inductive pick ups corresponding with the number of ignition coils for a particular model of engine.

3. The distributorless ignition adapter for diagnostic oscilloscopes as defined in claim 2, wherein the interface box has a plurality of receiving jacks and each of the several inductive pick ups has a lead wire terminating in a pick up plug which is adapted to mate with one of the plurality of receiving jacks.

4. A distributorless ignition adapter for diagnostic oscilloscopes, comprising:

an interface box having a plurality of receiving jacks;

an oscilloscope connection cord having a first end connected to the interface box and a second end terminating in an oscilloscope plug;

several inductive pick ups coupled with the interface box and adapted to sense passage of electrical current through ignition coils, sensed data relating to properties of the electrical current being transmitted to an oscilloscope via the interface box and the oscilloscope connection cord, each of the inductive pick ups being sufficiently flexible to wrap around an ignition coil, thereby enabling the inductive pick ups to be adapted to different sizes of ignition coil, each of the several inductive pick ups having a lead wire terminating in a pick up plug which is adapted to mate with one of the plurality of receiving jacks of the interface box, such that each of the several inductive pick ups is detachably secured to the interface box and a service technician is able to alter the number of inductive pick ups to correspond in one to one relation with the number of ignition coils for a particular model of engine having a coil on plug ignition system.

* * * * *